(12) United States Patent
Hatefi et al.

(10) Patent No.: US 8,948,232 B2
(45) Date of Patent: Feb. 3, 2015

(54) METHOD FOR TRANSMITTING A DIGITAL SIGNAL FOR A SEMI-ORTHOGONAL MARC SYSTEM HAVING HALF-DUPLEX RELAY, AND CORRESPONDING PROGRAM PRODUCT AND RELAY DEVICE

(75) Inventors: Atoosa Hatefi, Paris (FR); Raphaël Visoz, Vanves (FR); Antoine Berthet, Chatenay Malabry (FR)

(73) Assignee: Orange, Paris (FR)

( * ) Notice: Subject to any disclaimer, the term of this patent is extended or adjusted under 35 U.S.C. 154(b) by 165 days.

(21) Appl. No.: 13/513,462

(22) PCT Filed: Dec. 1, 2010

(86) PCT No.: PCT/FR2010/052583
§ 371 (c)(1),
(2), (4) Date: Oct. 12, 2012

(87) PCT Pub. No.: WO2011/067534
PCT Pub. Date: Jun. 9, 2011

(65) Prior Publication Data
US 2013/0022088 A1 Jan. 24, 2013

(30) Foreign Application Priority Data
Dec. 2, 2009 (FR) ...................................... 09 58573

(51) Int. Cl.
*H04B 7/204* (2006.01)
*H04L 1/00* (2006.01)
(Continued)

(52) U.S. Cl.
CPC .............. *H04L 1/004* (2013.01); *H04L 1/005* (2013.01); *H04L 2001/0097* (2013.01);
(Continued)

(58) Field of Classification Search
CPC ........... H04B 7/15521; H04B 7/15592; H04L 2001/0097; H04L 45/00; H04L 1/0048; H04L 1/0054; H04L 1/0077; H04L 25/03331; H04L 1/005; H03M 13/3746; H03M 13/3761
USPC .................... 714/752, 746, 699, E11.03, 755, 714/E11.021, E11.001; 375/148, 149, 147, 375/140, 130, 144, 141, 211, 340, 316; 370/315, 310, 340; 709/205, 204; 455/7
See application file for complete search history.

(56) References Cited

U.S. PATENT DOCUMENTS 5,694,404 A * 12/1997 Huang .......................... 714/751
2008/0101403 A1 * 5/2008 Michel et al. ................. 370/465
(Continued)

OTHER PUBLICATIONS

Wang, T.; Giannakis, G.B., "Complex Field Network Coding for Multiuser Cooperative Communications," Selected Areas in Communications, IEEE Journal on , vol. 26, No. 3, pp. 561,571, Apr. 2008.*

(Continued)

*Primary Examiner* — Chieh M Fan
*Assistant Examiner* — Michelle M Koeth
(74) *Attorney, Agent, or Firm* — David D. Brush; Westman, Champlin & Koehler, P.A.

(57) ABSTRACT

A method and device are provided for transmitting a digital signal intended for a network having at least four nodes including two transmitters, a relay and a receiver separated from one another by non-orthogonal links, except between the relay and the destination, between which the link is orthogonal, implementing a spatially distributed network code. The method includes: encoding, in each transmitter, supplying a code word for every block of K bits of information; transmitting, in the transmitters, the code word during $\alpha N$ transmission intervals, $\alpha \in [0,1]$; jointly, iteratively detecting/decoding, in the relay, in order to separate interfering streams from the transmitters and to determine, for each stream, a vector representing the K bits of information associated with the code word; jointly encoding, in the relay, the two vectors in order to determine redundancy information, and scheduling the relays to transmit the redundancy information during the $(1-\alpha)N$ following transmission intervals.

12 Claims, 6 Drawing Sheets

(51) Int. Cl.
  *H03M 13/00*   (2006.01)
  *H03M 13/05*   (2006.01)
  *G06F 11/08*   (2006.01)
  *H04B 7/155*   (2006.01)
  *H03M 13/37*   (2006.01)

(52) U.S. Cl.
  CPC ........ *H04B 7/15592* (2013.01); *H04B 7/15521* (2013.01); *H03M 13/3746* (2013.01); *H03M 13/3761* (2013.01)
  USPC .......... 375/211; 375/340; 375/316; 714/752; 714/746; 714/699; 714/E11.03; 714/E11.021; 714/E11.001

(56) References Cited

U.S. PATENT DOCUMENTS

2009/0287979 A1* 11/2009 Wang et al. .................. 714/752
2010/0207789 A1* 8/2010 Nieminen ....................... 341/81

OTHER PUBLICATIONS

Xi Cai; Qingchun Chen; Pingzhi Fan; Zheng Ma, "On the coded complex field network coding scheme for multiuser cooperative communications with regenerative relays," Communication Technology (ICCT), 2011 IEEE 13th International Conference on , vol., No., pp. 961,965, Sep. 25-28, 2011.*

Ghrayeb, Ali., et al., Coding for MIMO Communication Systems, May 2008, Wiley, Chapter 7, pp. 162-205.*

International Search Report and Written Opinion dated Jun. 4, 2011 for corresponding International Application No. PCT/FR2010/052583, filed Dec. 1, 2010.

Sankaranarayanan L et al., "Hierarchical sensor networks: capacity bounds and cooperative strategies using the multiple-access relay channel model", Sensor and Ad Hoc Communications and Networks, 2004. IEEE Secon 2004. 2004 First Annual IEEE Communications Society Conference on Santa Clara, CA, USA, Oct. 4, 2004, pp. 191-199.

Georg Zeitler et al., "Design of network coding functions in multihop relay networks", Turbo Codes and Related Topics, Sep. 1, 2008, pp. 249-254, 2008 5th International Symposium on, IEEE, Piscataway, NJ, USA.

Georg Zeitler et al., "An adaptive compress-and-forward scheme for the orthogonal multiple-access relay channel", Personal, Indoor and Mobile Radio Communications, Sep. 13, 2009, pp. 1838-1842, IEEE 20th International Symposium on, IEEE, Piscataway, NJ, USA.

Hausl C et al., "Joint network-channel coding for the multiple-access relay channel", 2006 3rd Annual IEEE Communications Society on Sensor and ADHOC Communications and Networks, Secon 2006-2006 3rd Annual IEEE Communications Society on Sensor and ADHOC Communications and Networks, Secon 2006 2007 Institute of Electrical and Electro, vol. 3, Sep. 25, 2006, pp. 817-822.

Hausl et al., "Iterative network and channel coding on a Tanner graph," Proc. Annual Allerton Conference on Communication, Control and Computing, Monticello, IL, 2005.

Bahl et al., "Optimal Decoding of Linear Codes for minimizing symbol error rate", IEEE Transactions on Information Theory, vol. IT-20(2), pp. 284-287, Mar. 1974.

Yang et al., "Network coding over a noisy relay: A belief propagation approach", in Proc. IEEE ISIT'07, Nice, France, Jun. 2007.

International Preliminary Report on Patentability and English translation of the Written Opinion dated Jul. 4, 2012 for corresponding International Application No. PCT/FR010/052583, filed Dec. 1, 2010.

* cited by examiner

METHOD FOR TRANSMITTING A DIGITAL SIGNAL FOR A SEMI-ORTHOGONAL MARC SYSTEM HAVING HALF-DUPLEX RELAY, AND CORRESPONDING PROGRAM PRODUCT AND RELAY DEVICE

CROSS-REFERENCE TO RELATED APPLICATIONS

This Application is a Section 371 National Stage Application of International Application No. PCT/FR2010/052583, filed Dec. 1, 2010, which is incorporated by reference in its entirety and published as WO 2011/067534 on Jun. 9, 2011, not in English.

STATEMENT REGARDING FEDERALLY SPONSORED RESEARCH OR DEVELOPMENT

None.

THE NAMES OF PARTIES TO A JOINT RESEARCH AGREEMENT

None.

FIELD OF THE DISCLOSURE

The field of the disclosure is that of the transmission of data coded in a MARC network. A MARC network is a telecommunication system with at least four nodes comprising at least two senders, a relay and a receiver. More precisely, the disclosure pertains to network coding and it relates to the improving of the quality of data transmission, and in particular the improving of the performance of the error-correcting decoding in a receiver.

The disclosure applies especially, but not exclusively, to the transmission of data via mobile networks, for example for real-time applications.

BACKGROUND OF THE DISCLOSURE

Networks, in particular mobile networks, are in search of appreciable gains in terms of capacity, reliability, consumption and the like. The transmission channel of a mobile network is presumed to be difficult and leads to relatively mediocre transmission reliability. Significant progress has been made in recent years, in regard to coding and modulation, especially in respect of considerations of consumption and capacity. Indeed, in a mobile network where several senders/receivers share the same resources (time, frequency and space) it is necessary to reduce to the maximum the transmit power.

This reduction runs counter to the coverage and therefore to the capacity of the system and more generally to its performance.

To increase the coverage, enhance the reliability of the communications and more generally to improve performance, one approach consists in employing relays to increase the spectral efficiency and therefore improve the transmission efficiency and the reliability of the systems. The topology of MARC systems, illustrated by FIG. 1, is such that the sources, nodes $S_1$ and $S_2$, broadcast their coded information sequences for the attention of the relay R and of the recipient D. The relay decodes the signals received from the sources $S_1$ and $S_2$ and re-encodes them jointly while adding inherent redundancy creating a spatially distributed network code. At the destination D, the decoding of the three spatially distributed coded sequences, comprising the two coded sequences received directly from the sources S1 and S2 and the coded sequence from the relay, relies on channel/network joint decoding algorithms.

Network coding is a form of cooperation according to which the nodes of the network share not only their inherent resources (power, band, etc.) but also their calculation capacity, so as to create increasingly powerful distributed coding as the information propagates through the nodes. It brings substantial gains in terms of diversity and coding and therefore of reliability of transmission.

Two types of operation for the relay are distinguished: half-duplex mode and full-duplex mode.

According to the half-duplex mode, two transmission phases are distinguished which correspond to different transmission intervals since the relay is incapable of receiving and sending simultaneously. During the first phase which comprises the first transmission intervals (time slots), the two sources send but not the relay. The relay decodes/re-encodes jointly so as to deduce the signal to be sent during the next transmission intervals. During the second phase which comprises the second transmission intervals, the relay sends the signal determined during the first transmission intervals and the sources send the second parity sequences relating to the same information as sent during the first transmission intervals. Relays of half-duplex type are attractive on account of a simple communication scheme and on account of the ease of implementing them and of their reduced cost which stem therefrom.

According to the full-duplex mode, the relay receives the new blocks of information from the two sources and simultaneously transmits to the recipient its code word based on the blocks previously received. In comparison to the half-duplex relay, the full-duplex relay makes it possible to achieve a greater capacity.

The articles C. Hausl, F. Schrenckenbach, I. Oikonomidis, G. Bauch, "Iterative network and channel coding on a Tanner graph," Proc. Annual Allerton Conference on Communication, Control and Computing, Monticello, Ill., 2005 and C. Hausl, P. Dupraz, "Joint Network-Channel Coding for the Multiple-Access Relay Channel," Proc. IEEE SECON'06, Reston, Va., September 2006 describe a channel/network joint coding for a MARC system, illustrated by FIG. 2. The MARC system considered is such that all the links CH14, CH24, CH13, CH43 and CH23 are orthogonal, furthermore the links between the two sources and the relay are assumed to be perfectly reliable. In the patent application the link is the communication channel between two or more nodes, it may be physical or logical. When the link is physical then it is generally called a channel. The two sources S1, S2 broadcast the coded information to the relay R and to the recipient D during the first transmission phase. The relay R linearly combines the assumed perfectly decoded streams of the two users according to a linear network coding scheme. During the second phase, the relay sends an additional parity sequence to the recipient D. This channel/network joint code may be considered, once all the streams have been received, stored and reorganized at the level of the recipient, as a spatially distributed channel/network joint code which may be iteratively decoded. This joint code brings substantial gains in terms of diversity and coding.

S. Yang and R. Koetter have evaluated the performance of network coding for a MARC system, illustrated by FIG. 3, with orthogonal links but in the presence of noisy source-relay links. S. Yang, R. Koetter, "Network coding over a noisy relay: A belief propagation approach", in Proc. IEEE ISIT'07, Nice, France, June 2007. The authors propose the "soft decode and forward" technique which relies on the generation of a discrete distribution of probabilities over the bits to be transmitted, obtained by an algorithm calculating the a posteriori probabilities (APP) over the coded bits/symbols. Each source S1, S2 generates a code word transmitted to the relay R. The relay R decodes them in the form of a logarithmic probability ratio (LLR) by using a BCJR decoding algorithm, the initials stemming from the name of its authors L. Bahl, J. Cocke, F. Jelinek, and J. Raviv, and then performs a memoryless weighted network coding corresponding to the bitwise sum modulo two (XOR operation) of the two code words received, the weighted coding consisting in generating on the basis of the LLRs $L_1$, $L_2$ of the two sources a third LLR $L_R$ corresponding to the XOR operation. L. Bahl, J. Cocke, F. Jelinek, and J. Raviv, "Optimal Decoding of Linear Codes for minimizing symbol error rate", IEEE Transactions on Information Theory, vol. IT-20(2), pp. 284-287, March 1974. This third LLR is ultimately transmitted in an analog manner to the destination D. Thus, the recipient has three observations: those emanating from the two sources and the LLR. The recipient performs jointly and in an iterative manner a decoding of the streams of the source $S_1$ and of the source $S_2$ by utilizing the additional information provided by the relay. The article describes that, even for severely noisy links $S_1 \rightarrow R$ and $S_2 \rightarrow R$, the network coding affords a coding gain with respect to a scheme without cooperation, therefore without any relay. The method is described in the case of a BPSK modulation and cannot be transposed to a modulation with an order greater than four since the expression calculated during the $3^{rd}$ step can apply only for a modulation of order two or four (e.g. QPSK).

In these various known systems, the decoding errors are reduced solely in the absence of interference since the MARC system considered is assumed interference-free on account of the orthogonal links. Furthermore, the constraint which consists in imposing orthogonal links leads to non-optimal use of the spectral resource and therefore to a limitation of the capacity of the network.

SUMMARY

The subject of an embodiment of the invention is a method for transmitting a digital signal intended for a network with at least four nodes comprising two senders, a relay and a receiver separated from one another by non-orthogonal links except between the relay and the destination, between which the link is orthogonal, implementing a spatially distributed network code, comprising:

a step of coding, in each sender, delivering a code word per block of K information bits, a step of sending, in the senders, the code word during $\alpha N$ transmission intervals, $\alpha \in [0,1]$, a step of iterative joint detection/decoding, in the relay, so as to separate the interfering streams originating from the senders and determine per stream a vector representative of the K information bits associated with the code word, a step of joint coding, in the relay, of the two vectors so as to determine redundancy information, a scheduling in the relay so as to send the redundancy information during the $(1-\alpha)N$ following transmission intervals.

The subject of an embodiment of the invention is furthermore a relay intended for a semi-orthogonal MARC system.

Thus, a relay according to an embodiment of the invention, intended for the implementation of a method of transmission according to an embodiment of the invention, comprises:

a means of iterative joint detection/decoding for separating the interfering streams originating from two senders of the semi-orthogonal MARC system and for determining, per stream, a vector representative of K information bits associated with a code word sent by a sender during $\alpha N$ transmission intervals, $\alpha \in [0,1]$, a means of joint coding of the vectors of the two streams for determining redundancy information, a means for sending the redundancy information during $(1-\alpha)N$ transmission intervals which follow the $\alpha N$ transmission intervals during which the code words are sent by the two senders.

The step of sending by the senders occurs in a simultaneous manner thereby making it possible to make maximum use of the common spectral resource. There is therefore interference between the signals received by the relay and there is interference between the signals received by the destination on account of the superposition of the source signals during the transmission on the one hand between the senders and the relay and on the other hand between the senders and the destination (the receiver). Stated otherwise, the transmission from the sources is non-orthogonal, that is to say, the sources simultaneously use the same radio resource, for example in terms of time, frequency or code.

Thus, an embodiment of the invention relies in particular on the introduction of a step of joint detection/decoding and of a joint coding in the relay, thereby making it possible to separate the streams sent simultaneously by the two sources and to afford all the dispersed senders the benefit of the coding gain of a spatially distributed network code without decreasing the spectral efficiency. Indeed, the approach of an embodiment of the invention makes it possible to implement, in the receivers, an iterative decoding based on a redundancy generated in the relays and received by the destination without interference in the absence of simultaneous sending by the senders, without making it necessary to increase the power in the senders in order to achieve an increase in the coverage of the system and the spectral efficiency.

According to a particular embodiment, a method of transmission is such that the iterative joint detection/decoding step implements a hard decoding.

This mode of decoding with a hard decision about the value of each of the bits received in the relay is more particularly adapted to a semi-orthogonal MARC system in which the links are perfectly reliable. In this context, the information emanating from the sources can be decoded by the relay without error. A hard decoding is therefore particularly adapted to such a semi-orthogonal MARC system since it is of reduced complexity with respect to a soft decoding and fast to implement.

According to a particular embodiment, a method of transmission is such that the iterative joint detection/decoding step implements a soft decoding and the joint coding step implements a soft coding and a marginalization performed at the bit level.

This mode of decoding is more particularly adapted to a semi-orthogonal MARC system with Rayleigh-fading channels and with a lack of knowledge at the levels of the sources of the source/relay channels. In this context, there exists a nonzero probability that the information emanating from the sources will be decoded imperfectly by the relay. The choice of a soft decoding makes it possible to limit the propagation of errors by the relay.

According to a particular embodiment, a method of transmission is such that the iterative joint detection/decoding step implements a soft decoding and the joint coding step implements a soft coding and a compression.

This mode of decoding is more particularly adapted to a semi-orthogonal MARC system with Rayleigh-fading channels and with a lack of knowledge at the levels of the sources of the source/relay channels. In this context, there exists a nonzero probability that the information emanating from the sources will be decoded imperfectly by the relay. The choice of a soft decoding makes it possible to limit the propagation of errors by the relay. Furthermore, the soft coding followed by a compression makes it possible to use any modulation at the relay in contradistinction to the mode with soft coding and marginalization which imposes the use of a BPSK (or QPSK) modulation at the relay.

According to a particular embodiment, a method of transmission is such that the compression is performed by using a mean squared uncorrelated error criterion (MMSUE).

The use of the MMSUE criterion makes it possible to perform optimal estimation at the relay on the basis of the a posteriori probabilities and therefore makes it possible to maximize the SNR at the destination by reducing the number of errors in the relay.

According to a particular embodiment, a method of transmission implements a turbo code distributed between the senders and the relay. Furthermore, the coding step in the senders implements a convolutional coder.

For example, the distributed turbo code consists, at a sender, of an RSCC convolutional code of rate ½, and at the relay of an RSCC of rate ⅔ preceded by an interleaver for each stream arising from the decoder. The choice of a distributed turbo code with parallel concatenation allows a very simple implementation of a spatially distributed network coding for a semi-orthogonal MARC system with a half-duplex relay by having by construction a code composed of a concatenation of a systematic part and of two redundancy parts (a first redundancy part determined and sent by sender and a second redundancy part determined and sent by the relay). This concatenation makes it possible for the systematic part and the first redundancy part to be sent by one of the senders during the first transmission interval and for the second redundancy part to be sent by the relay during the second transmission interval. This concatenation therefore simply enables the relay to provide new redundancy information to the information bits corresponding to the systematic part independently of the first redundancy part transmitted during the first transmission interval from the senders to the destination. The destination therefore has several redundancies, thereby allowing very powerful decoding and therefore an improvement in reliability.

The subject of an embodiment of the invention is furthermore a method of reception intended for a receiver of a semi-orthogonal MARC system intended to implement a method of transmission according to an embodiment of the invention. The method of reception comprises:
  a step of storage in a block of data received during $\alpha N$, transmission intervals, $\alpha \epsilon [0,1]$, corresponding to K information bits coded per sender in the form of a code word sent during the $\alpha N$ transmission intervals,
and comprising in an iterative manner:
  a step of detection of redundancy information originating from a relay and received during $(1-\alpha)N$ transmission intervals which follow the $\alpha N$ transmission intervals,
  a detection step for separating the interfering streams originating from the senders on the basis of a block of data received,
  a joint decoding step for determining per sender a decoding value for the K information bits by jointly decoding the separate streams and the detected redundancy information.

The subject of an embodiment of the invention is furthermore a receiver intended for a semi-orthogonal MARC system intended to implement a method of transmission according to an embodiment of the invention. The receiver comprises:
  a means for storing in a block data received during $\alpha N$ transmission intervals, corresponding to K information bits coded per sender in the form of a code word sent during the $\alpha N$ transmission intervals, $\alpha \epsilon [0,1]$,
  two means of block detection in parallel, followed by a joint decoder for, in an iterative manner, separating the two interfering streams originating from the senders during the $\alpha N$ transmission intervals, detecting the stream originating from the relay during the $(1-\alpha)N$ following transmission intervals and determining on the basis of the separate streams and of the detected stream, a decoding value for the K information bits per sender.

The advantage of this method of reception and this receiver is that they are adapted to a semi-orthogonal MARC system implementing a method of transmission according to an embodiment of the invention.

The various modes of embodiment above may or may not be combined with one or more of these modes to define another mode of embodiment.

The subject of an embodiment of the invention is furthermore a semi-orthogonal MARC system, optionally MIMO, adapted for the implementation of a method according to an embodiment of the invention.

Thus, a semi-orthogonal MARC system according to an embodiment of the invention comprises a relay according to an embodiment of the invention.

According to a preferred implementation, the steps of the method of transmission, respectively of reception, are determined by the instructions of a transmission program, respectively reception program, incorporated into one or more electronic circuits such as microchips, themselves possibly being disposed in electronic devices of the semi-orthogonal MARC system. The method of transmission, respectively of reception, according to an embodiment of the invention can equally well be implemented when this program is loaded into a calculation facility such a processor or equivalent, operation of which is then controlled by the execution of the program.

Consequently, an embodiment of the invention also applies to a computer program, especially a computer program on or in an information medium, suitable for implementing an embodiment of the invention. This program can use any programming language, and be in the form of source code, object code, or of code intermediate between source code and object code such as in a partially compiled form, or in any other desirable form for implementing a method according to an embodiment of the invention.

The information medium may be any entity or device capable of storing the program. For example, the medium can comprise a storage means, such as a ROM, for example a CD ROM or a microelectronic circuit ROM, or else a magnetic recording means, for example a diskette (floppy disk) or a hard disk.

Alternatively, the information medium may be an integrated circuit into which the program is incorporated, the circuit being adapted for executing or to be used in the execution of the method in question.

Moreover, the program may be translated into a transmissible form such as an electrical or optical signal, which may be conveyed via an electrical or optical cable, by radio or by other means. The program according to an embodiment of the invention may be in particular downloaded from a network of Internet type.

BRIEF DESCRIPTION OF THE DRAWINGS

Other characteristics and advantages will be more clearly apparent on reading the following description of preferential embodiments, given by way of simple illustrative and non-limiting examples, and of the appended drawings, among which.

DETAILED DESCRIPTION OF ILLUSTRATIVE EMBODIMENTS

Figure 1:
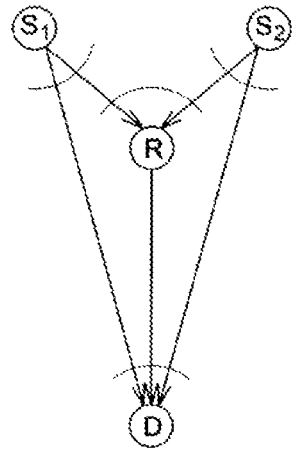
FIG. 1 is a diagram illustrating the basic topology of MARC systems.
Figure 2:
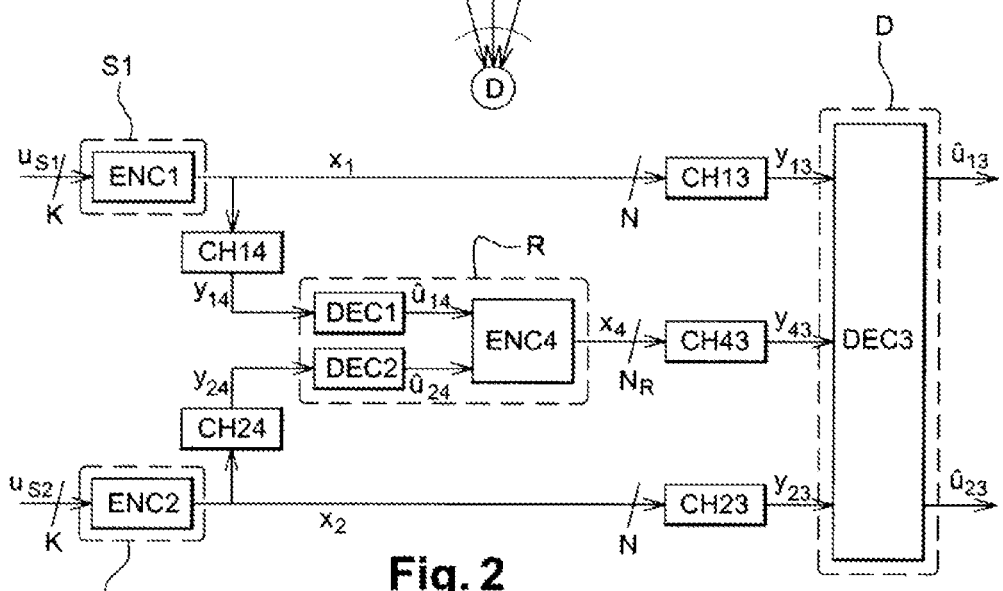
FIG. 2 is a first example of a MARC system of the prior art with orthogonal links between the various nodes.
Figure 3:
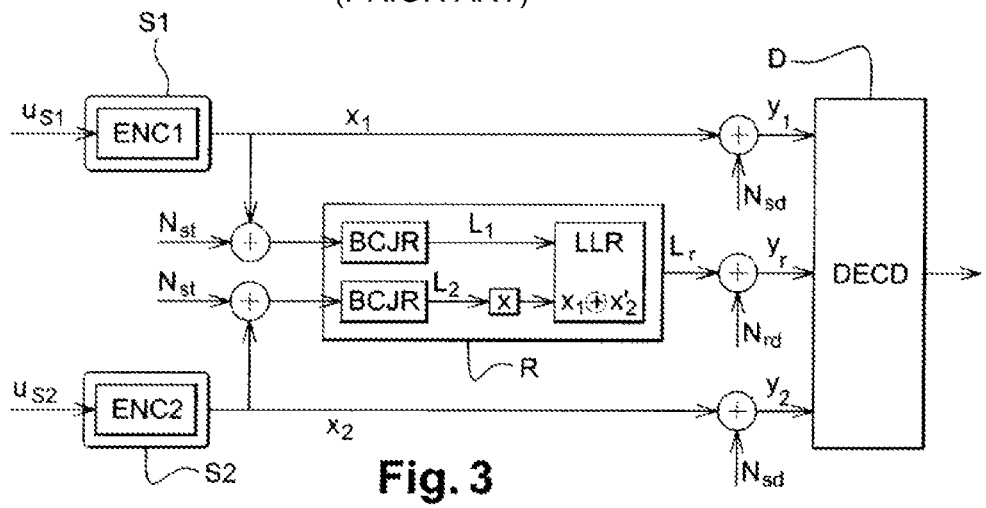
FIG. 3 is a second example of a MARC system of the prior art with orthogonal links between the various nodes.
Figure 4:
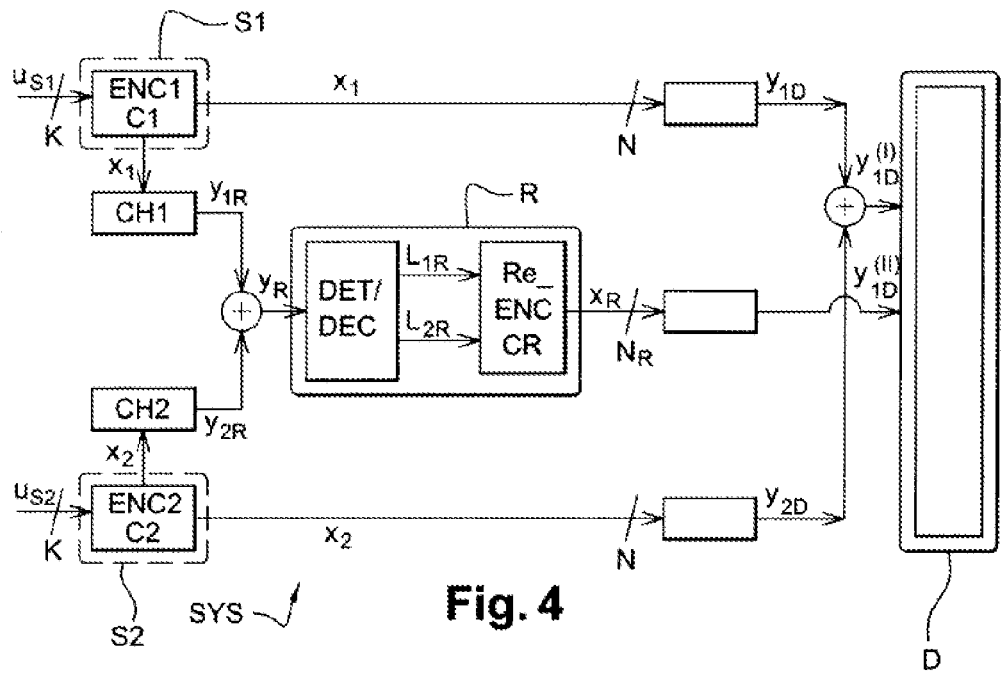
FIG. 4 is an example of a semi-orthogonal MARC system according to an embodiment of the invention with an orthogonal link between the relay and the destination, and non-orthogonal links between the senders and the relay and between the senders and the destination.
Figure 5:
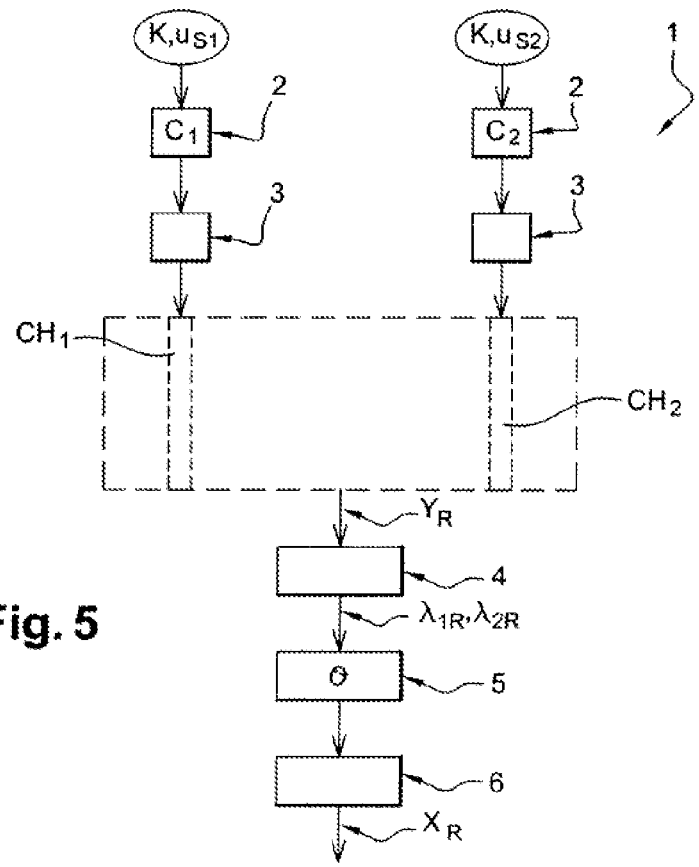
FIG. 5 is a simplified flowchart of the method of transmission according to an embodiment of the invention implemented by a semi-orthogonal MARC system illustrated by FIG. 4.

An embodiment of the invention proposes a new approach to the use of a relay of a semi-orthogonal MARC system illustrated by FIG. 4, to improve the spectral efficiency of the transmission according to a method 1 according to an embodiment of the invention, illustrated by FIG. 5, while allowing simple and efficient decoding in the receiver.

There is no constraint on the transmission channel; it may be a fast fading or slow fading channel, it may be frequency selective, and it may be MIMO. In the subsequent description, the two sources, the relay, and the destination are assumed to be perfectly synchronized and the two sources are independent (there is no correlation between them).

The following notation is used in the patent application.

All vectors use bold characters.

A vector v has its $k^{th}$ element denoted $[v]_k$ or $v_k$.

A multidimensional function F pertains at input to a matrix A of dimension m×q where each element $a_{i,j}$ (for all i=1, ..., m and j=1, ..., q) belongs to the set E and determines a matrix B of dimension n×p each element $b_{i,j}$ of which (for all i=1, ..., n and j=1, ..., p) belongs to the set G, such that F(A)=B denoted:

$$F:E^{m \times q} \to G^{n \times p}$$

The probability density of a complex random variable x which follows a Gaussian distribution having circular symmetry with mean $\mu_x$ and covariance $\sigma_x^2$ denoted: $CN(\mu_x, \sigma_x^2)$.

$F_2$ is the Galois field with two elements, R the field of real numbers and C the field of complex numbers. Let X be a matrix of dimension N×M belonging to the field E, that is to say $X \in E^{N \times M}$, $x_k$ denotes its $k^{th}$ column (k=1, ..., M).

Functions use non-italic upper-case characters.

Let x be a discrete random variable with the probability law p(x), E(x) denotes the mathematical expectation of x:

$$E(x) = \sum_i x_i p(x_i)$$

The two statistically independent sources S1, S2 (the two senders) equipped respectively with $T_{S_1}$ and $T_{S_2}$ antennas, perform a coding 2 of the information data $u_{S_1}, u_{S_2}$ segmented per block of K bits by applying schemes for modulation and space time channel coding $C_1$, and $C_2$ implemented by coders ENC1 and ENC2. The scheme for modulation and coding $C_1$, respectively $C_2$, of a source therefore makes it possible to associate 2 with any information vector $u_{S_1} \in F_2^K$, respectively $u_{S_2} \in F_2^K$, coded and modulated symbols $X_{S_1} \in \chi_1^{T_{S1} \times N_s}$, respectively $X_{S_2} \in \chi_2^{T_{S2} \times N_s}$ belonging to the complex constellations $\chi_1$ and $\chi_2$ with cardinalities $|\chi_1|=2^p$ and $|\chi_2|=2^q$ (p,q $\in \mathbb{N}$):

$$C_1: F_2^K \to \chi_1^{T_{S1} \times N_s}$$

$$C_2: F_2^K \to \chi_2^{T_{S2} \times N_s}$$

$X_{S_1}$ and $X_{S_2}$ are subsequently dubbed final code words sent respectively by the sources $S_1$ and $S_2$.

The sources send 3 thereafter, during a first phase, the final code words $X_{S_1} \in \chi_1^{T_{S1} \times N_s}$ and $X_{S_2} \in \chi_2^{T_{S2} \times N_s}$ during $N_s = \alpha N$ uses of channel ($\alpha N$ transmission intervals) with $\alpha \in [0,1]$.

The relay R equipped with $R_x$ receive antennas and $T_R$ transmit antennas receives, during the first phase, the data $Y_R \in C^{R_x \times N_s}$ which are a superposition of the code words $Y_{1R} \in C^{R_x \times N_s}$, $Y_{2R} \in C^{R_x \times N_s}$ (or at least of some of them) transmitted by the channel CH1, CH2.

Hereinafter in the document, the generic terms "code words" are used in relation to $X_{S_1}$ and $X_{S_2}$ and more generally for all vectors/matrices obtained on completion of a coding with a modulation and coding scheme Ci.

The code words $Y_{1R}, Y_{2R}$ are therefore a disturbed version of the code words sent $X_{S_1}, X_{S_2}$ and their superposition can be expressed in the form:

$$y_{R,k} = y_{1R,k} + y_{2R,k} \quad (1)$$
$$= \sum_{m=0}^{M} H_{S_1R,k,m} x_{S_1,k-m} + \sum_{m=0}^{M} H_{S_2R,k,m} x_{S_2,k-m} + n_{SR,k}$$
$$k = 1, \ldots, \alpha N, \alpha \in [0, 1]$$

Where $n_{SR,k} \in C^{R_x}$ denotes the additive noise vector, $H_{S_1R} \in C^{R_x \times T_{S1}}$ and $H_{S_2R} \in C^{R_x \times T_{S2}}$ denote the matrices of fading coefficients for the fading between the two sources and the relay, and M denotes the memory of the channel (the memory effect of the channel is related to the propagation delay or delay spread). This delay gives rise to a superposition of the transmitted signals, which is manifested by interference between the symbols.

The relay R carries out joint detection/decoding 4 of the data received in a "hard" manner or "soft" manner by means of a joint detector/decoder DET/DEC so as to deduce therefrom the real-valued vectors $\lambda_{1R} \in R^K, \lambda_{2R} \in R^K$ representative of the binary data of the two sources.

The relay applies 5 thereafter on the basis of these two vectors $\lambda_{1R}$ and $\lambda_{2R}$ a function $\Theta$, detailed subsequently, so as to obtain the redundancy information $X_R = \Theta(\lambda_{1R}, \lambda_{2R}) \in C^{T_R \times N_R}$ which is dispatched 6 to the destination by the relay on $N_R = (1-\alpha)N$ uses of the channel and during the second transmission phase (N denotes the total number of uses of the channel during the two transmission phases).

During this second phase, the sources do not send.

The recipient observes a superposition of the symbols sent by the sources during the first transmission phase and of the symbols sent by the relay during the second phase. The recipient performs an iterative joint detection/decoding to recover the messages $u_{S_1}$ and $u_{S_2}$ on the basis of these signals.

According to various embodiments, the basic topology may be repeated to determine a semi-orthogonal MARC system with several relays and several destinations, each relay being associated with at least two senders and a receiver. According to other embodiments, the two senders of a basic topology can make only one with at least two transmit antennas. In all cases, the relay and the receiver receive code words transmitted via distinct transmission channels.

Each relay R therefore provides redundancy code words $X_R$ which make it possible to improve the decoding at the receiver. These redundancy code words are formed by separating the streams originating from the two senders since the code words $Y_{1R}, Y_{2R}$ originating from the two senders $S_1, S_2$ are superposed in one and the same stream received $Y_R$ on account of the non-orthogonal links $S1 \rightarrow R$, $S2 \rightarrow R$, and by jointly coding the values extracted from the superposed streams.

Numerous variant implementations may be envisaged, as a function of the type of coding, of the concatenation of the codes (parallel, serial, or arbitrary).

Numerous types of codes may be used in the senders and in the relays, as long as they are linear codes. They may in particular be:
convolutional codes;
BCH codes;
RS codes;
turbo-codes;
binary or non-binary LDPC codes;
parity codes.

It is possible to use the same code in the senders and the relays, or different codes.

According to a first embodiment, the MARC system illustrated by FIG. 4 comprises links CH1, CH2 between the sources S1, S2 and the relay R which are assumed to be perfectly reliable, stated otherwise the links are of very good quality and the decoding is almost error-free.

Figure 6:
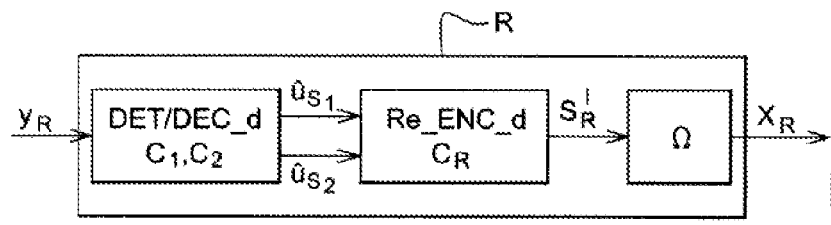
FIG. 6 is a diagram of a first embodiment of a relay according to the invention.

The relay R, illustrated by FIG. 6, decodes in a hard manner the data of the two sources with the aid of a hard joint detector/decoder DET/DEC_d and it re-encodes them jointly with the aid of a hard joint coder Re_ENC_d on the basis of the modulation and space time coding scheme $C_R$.

The outputs $\hat{u}_{S_1}, \hat{u}_{S_2}$ of the joint detector/decoder DET/DEC_d take binary values utilized by the joint coder Re_ENC_d:

$$\lambda_{1R} = \hat{u}_{S_1} \in F_2^K$$

$$\lambda_{2R} = \hat{u}_{S_2} \in F_2^K$$

The hard joint coder Re_ENC_d utilizes as input two vectors of binary values and produces a matrix of discrete symbols $S_R^1 \in \chi_R^{T_R \times N_1}$ where $\chi_R$ is a complex constellation with cardinality $|\chi_R| = 2^m$ ($m \in \mathbb{N}$) by applying the modulation and space time coding scheme $C_R$:

$C_R : F_2^K \times F_2^K \rightarrow \chi_R^{T_R \times N_1}$ which produces the discrete symbols $S_R^1 \in \chi_R^{T_R \times N_1}$.

Thereafter, a columns selection function $\Omega$ is applied:

$\chi : X_R^{T_R \times N_1} \rightarrow \chi_R^{T_R \times N_0}$, $N_0 \leq N_1$ which chooses $N_0$ columns of the matrix $S_R^1 \in \chi_R^{T_R \times N_1}$ to obtain the redundancy symbols $S_R \in \chi_R^{T_R \times N_0}$ such that $S_R = \Omega(S_R^1)$.

The relay sends these discrete symbols $X_R$ during $N_0 = N_R$ transmission intervals. These discrete symbols $X_R$ may be expressed in the form:

$$X_R = \beta S_R = \Theta(\hat{u}_{S_1}, \hat{u}_{S_2}) \in \chi_R^{T_R \times N_R}$$

where $\beta$ is a power normalization factor and $\Theta$ is a deterministic function of the estimated data of the two sources.

According to a second embodiment, the semi-orthogonal MARC system illustrated by FIG. 4 comprises links CH1, CH2 between the sources S1, S2 and the relay R with a Rayleigh fading. Furthermore, the sources do not have any knowledge of the link separating a source from the relay. There consequently exists a nonzero probability that the messages of the two sources will be decoded imperfectly by the relay. Under these conditions, there is a risk of the relay propagating errors to the recipient.

This mode allows the consideration at the level of the recipient during the joint decoding, of the decoding errors occurring at the relay.

Figure 7:
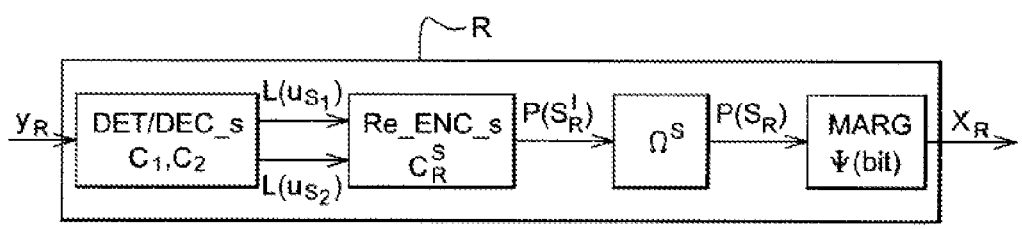
FIG. 7 is a diagram of a second embodiment of a relay according to the invention.
Figure 8:
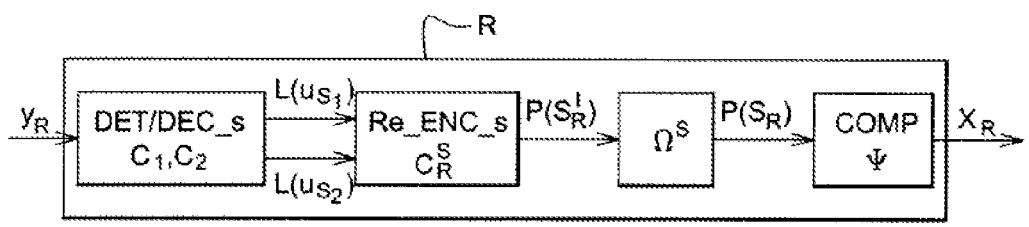
FIG. 8 is a diagram of a third embodiment of a relay according to the invention.

According to this mode, the relay R illustrated by FIGS. 7 and 8, performs a soft joint detection/decoding by means of a soft joint detector/decoder DET/DEC_s so as to obtain the a posteriori probabilities (APP) of the information bits, ({P($u_k = 0, 1$)}).

The APPs of the information bits are calculated in the form of a likelihood ratio (LLR Log-Likelihood-Ratio) defined as:

$$[\lambda_{iR}]_k = L(u_{S_i,k}) = [L(u_{S_i})]_k = \ln \frac{P(u_{S_i,k} = 1)}{P(u_{S_i,k} = 0)}$$

$$k = 1, \ldots, K \ \ i = 1, 2.$$

Thus:

$$\lambda_{1R} = L(u_{S_1}) \in R^K$$

$$\lambda_{2R} = L(u_{S_2}) \in R^K$$

The relay thereafter performs a weighted space time joint network re-encoding with the aid of a joint coder Re_ENC_s, detailed subsequently, on the basis of the modulation and coding scheme $C_R$:

$$C_R : F_2^K \times F_2^K \rightarrow \chi_R^{T_R \times N_1}$$

The coder utilizes two vectors of binary values and produces a matrix of discrete symbols $S_R^1$ belonging to $\chi_R^{T_R \times N_1}$ where $\chi_R$ is a complex constellation with cardinality $|\chi_R| = 2^m$ ($m \in \mathbb{N}$).

The weighted space time network encoding function which uses a BCJR algorithm applied to the code $C_R$ is represented in the form:

$$C_R^S : R^K \times R^K \rightarrow R^{(|\chi_R|^{T_R} - 1) \times N_1}$$

The weighted network encoding function, implemented by the joint coder Re_ENC_s, utilizes two real-valued vectors (the vectors of LLRs of the decoded bits), and provides the probabilities of the symbols ($T_R$ dimensional) $S_{R,k}^1 \in \chi_R^{T_R}$ in the form of ($2^{mT_R}-1$) LLRs:

$$\ln \frac{P(s_{R,k}^1 = a_i)}{P(s_{R,k}^1 = a_0)}$$

i.e.:

$$P(S_R^1)_{i,k} = \ln \frac{P(s_{R,k}^1 = a_i)}{P(s_{R,k}^1 = a_0)}$$

with $$a_i \in \chi_R^{T_R} \text{ et } \bigcup_{i=0}^{2^{mT_R}-1} \{a_i\} = \chi_R^{T_R},$$

$$i = 1, \ldots, 2^{mT_R}-1, k = 1, \ldots, N_1.$$

thereby determining the matrix $P(S_R^1) \in R^{(|\chi_R|^{T_R}-1) \times N_1}$.
At the end, a columns selection function $\Omega^S$ (which deletes all the probabilities relating to the vectors deleted by the columns selection function $\Omega$) is applied to the matrix $P(S_R^1) \in R^{(|\chi_R|^{T_R}-1) \times N_1}$. Thus, we define the function $$\Omega^S: R^{(|\chi_R|^{T_R}-1) \times N_1} \to R^{(|\chi_R|^{T_R}-1) \times N_0}, N_0 \leq N_1 \text{ such that}$$
$$P(S_R) = \Omega^S(P(S_R^1))$$

This columns selection function makes it possible to choose the size of redundancy to be dispatched to the receiver. This has the advantage of introducing flexibility into the method and, in particular, of adapting the size of redundancy as a function of the code used at the send end.

The relay illustrated by FIG. 7 corresponds to a particular mode according to which the joint re-encoding is followed by a marginalization MARG before the sending of the redundancy vector.

This particular mode is adapted for a relay in which the modulation and space time coding scheme $C_R$ is based on a binary coding function (possibly comprising an interleaver): $C: F_2^K \times F_2^K \to F_2^{N_1 \times T_R \times m}$ and on a modulation (a bit to symbol coding function) associating bits with symbols $\phi_R: F_2^m \to \chi_R \subseteq \mathbb{C}$ ($\subseteq$ signifies "subset of"), where $\chi_R$ denotes the constellation of the symbols obtained of cardinality $|\chi_R|=2^m$, that is to say $s_{R,k,t}^1 = \phi_R(c_{R,k,t(1)}^1, \ldots, c_{R,k,t(m)}^1)$. An example of this coding and space time modulation scheme is the ST-BICM.

The marginalization operation $\Psi$ consists in calculating the probabilities at the bit level on the basis of the symbol probabilities $P(s_{R,k})$ stored in the form $P(S_R)_{i,k}$, to provide logarithms of an APP ratio.

By assuming that $C_R \in F_2^{N_0 \times T_R \times m}$ is the binary redundancy information and that $c_{R,k,t(l)} = \phi_{R(l)}^{-1}(S_{R,k,t})$ denotes the $l^{th}$ bit of the symbol $s_{R,k,t}$ (k=1, \ldots, N_0, l=1, \ldots, m, t=1, \ldots, T_R$), the application of the marginalization function $\Psi$ described by the expression: $\Psi: R^{(|\chi_R|^{T_R}-1) \times N_0} \to R^{T_R \times m \times N_0}$ makes it possible to obtain the LLRs $L(c_{R,k,t(l)})$ of the bits $c_{R,k,t(l)}$:

$$L(c_{R,k,t(l)}) = \ln \left( \frac{P(c_{R,k,t(l)} = 1)}{P(c_{R,k,t(l)} = 0)} \right)$$

on the basis of the probabilities:

$$P(c_{R,k,t(l)} = b) = \sum_{a \in \chi_R^{T_R}: \varphi_l^{-1}(a_t) = b} P(s_{R,k} = a) \quad b = 0, 1$$

Where:

$$P(s_{R,k} = a_i) = c_0 e^{P(S_R)_{i,k}} i = 1, \ldots, 2^{mT_R}-1$$

with $$c_0 = P(s_{R,k} = a_0) = \frac{1}{1 + \sum_{i=1}^{2^{mT_R}-1} e^{P(S_R)_{i,k}}}$$

Consider the matrix $L(c_R) \in R^{T_R \times mN_0}$ defined as follows $[L(c_R)]_{t,(k-1)m+l} = L(c_{R,k,t(l)})$ k=1, \ldots, N_0, t=1, \ldots, T_R, l= 1, \ldots, m,
then the redundancy information $X_R = \beta L(c_R)$ is forwarded to the receiver during $N_R = mN_0$ transmission intervals ($N_R = mN_0/2$ if the method uses the quadrature and in phase pathway) where $\beta$ is a power normalization factor.

This particular mode is applicable to all the modulations, but as the relay transmits the soft values corresponding to the bits, in the form of an LLR, the spectral efficiency is limited to that available for the BPSK (or QPSK) modulation.

The relay illustrated by FIG. 8 corresponds to a particular mode according to which the joint re-encoding is followed by a compression COMP before the sending of the redundancy vector. The compression function $\Psi$ can be expressed in the form:

$$\Psi: R^{(|\chi_R|^{T_R}-1) \times N_0} \to \mathbb{C}^{T_R \times N_0}$$

The advantage of the operation for compressing the distribution of the probabilities is to allow the transmission of all the soft information relating to the probabilities of a symbol that are provided by the encoder over a single transmission interval, whatever the modulation of the modulation and coding scheme $C_R$.

Figure 9:
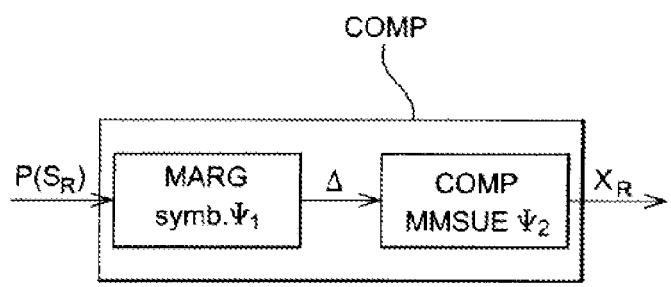
FIG. 9 is a diagram of an example of compression implemented at the relay.

The following example corresponds to the particular case of an MMSUE compression. The diagram of the operations at the relay for implementing the MMSUE compression is illustrated by FIG. 9.

The symbols-level marginalization function $\Psi_1$ represented by:

$$\Psi_1: R^{(|\chi_R|^{T_R}-1) \times N_0} \to R^{T_R \times (|\chi_R|-1) \times N_0}$$

utilizes the vectors of the LLRs $$P(S_R) \in R^{(|\chi_R|^{T_R}-1) \times N_0}$$

and provides the LLRs $\Delta_{i,j,k}$.
I.e.:
$\Delta \in R^{T_R \times (|\chi_R|-1) \times N_0}$ with:

$$\Delta_{t,j,k} = \ln \frac{P(s_{R,k,t} = b_j)}{P(s_{R,k,t} = b_0)}$$

and $b_j \in \chi_R, \bigcup_{i=0}^{2^m-1} \{b_j\} = \chi_R,$ $j = 1, \ldots, 2^m-1, k = 1, \ldots N_0, t = 1, \ldots, T_R$ Where:

$$P(s_{R,k,t} = b_j) = \sum_{i:a_{i,t}=b_j} P(s_{R,k} = a_i) = \sum_{i:a_{i,t}=b_j} c_0 e^{P(s_R)_{i,k}}$$

$$b_j \in \chi_R, j = 0, \ldots, 2^m - 1, i = 1, \ldots, 2^{mT_R} - 1,$$

$$c_0 = P(s_{R,k} = a_0) = \frac{1}{1 + \sum_{i=1}^{2^{mT_R}-1} e^{P(s_R)_{i,k}}}$$

This marginalization function may be integrated directly into the step of soft re-encoding/modulation according to a particular realization.

The MMSUE compression function $\Psi_2$ consists in calculating the expectation of the symbols $S_{R,k,t}$. It is represented in the form:

$$\Psi_2 : R^{T_R \times (|\chi_R|-1) \times N_0} \to C^{T_R \times N_0}.$$

It utilizes the LLRs $\Delta_{i,j,k}$ and calculates:

$$E(s_{R,k,t}) = \sum_{j=0}^{|\chi_R|-1} b_j P(s_{R,k,t} = b_j) = \sum_{j=0}^{|\chi_R|-1} b_j K_0 e^{\Delta_{t,j,k}}$$

$$b_j \in \chi_R, j = 0, \ldots, 2^m - 1, \text{ with}$$

$$K_0 = P(s_{R,k,t} = b_0) = \frac{1}{1 + \sum_{j=1}^{|\chi_R|-1} e^{\Delta_{t,j,k}}}, \Delta_{t,0,k} = 0$$

The calculated expectations $E(s_{R,k,t})$ are stored in a matrix $E(s_R) \in C^{T_R \times N_0}$ and the redundancy information $X_R = \beta E(s_R)$ is dispatched to the destination during $N_R = N_0$ uses of the channel where $\beta$ is a power normalization factor.

In the subsequent description of a particular exemplary implementation of a relay, the sources S1, S2 (the senders) are assumed to implement BICM (Bit Interleaved Coded Modulation) modulation and coding schemes, that is to say these schemes comprise a serial concatenation of a binary encoder, of a bitwise interleaver (dubbed the channel interleaver) and of a modulator. The senders considered therefore comprise bit-level pseudo-random interleavers, before the transmission of the signals. Consequently, both the relay and the receiver comprise the corresponding deinterleavers. The interleavers are used to break the correlation between the consecutive bits transmitted, thereby making it possible to perform iterative joint detection/decoding more efficiently.

To simplify the notation, it is assumed subsequently that a single transmit antenna and a single receive antenna are used in all the senders and receivers, therefore, $T_{S_1} = T_{S_2} = R_x = 1$. Furthermore, it is assumed that the Rayleigh fadings are quasi-static, that the channel is memory-less and that the receivers have perfect knowledge of the variance of the noise and of the fading coefficients.

The coding schemes corresponding to the two sources associate with any message vector $u_{S_1} \in F_2^K$ and $u_{S_2} \in F_2^K$ coded bits $c_{S_1} \in F_2^{n_1}$ and $c_{S_2} \in F_2^{n_2}$ ($n_1$ and $n_2$: lengths of the coded bits) which are interleaved to give $V_{S_1} \in F_2^{N_s \times p}$ and $V_{S_2} \in F_2^{N_s \times q}$, and then modulated (on the basis of the modulation schemes of the two sources) to the symbols (code words) $x_{S_1} \in \chi_1^{N_s}$ and $x_{S_2} \in \chi_2^{N_s}$ which belong to a complex constellation. By assuming that the labels used are $\phi_1 : F_2^p \to \chi_1 \subseteq C$ and $\phi_2 : F_2^q \to \chi_2 \subseteq C$, where each modulated symbol of $S_1$ and $S_2$ belongs respectively to the complex sets $\chi_1$ and $\chi_2$ with cardinalities $|\chi_1| = 2^p$ and $|\chi_2| = 2^q$ then $v_{S_i,k(l)} = \phi_{i(l)}^{-1}(x_{S_i,k})$ denotes the $l^{th}$ bit of the binary label of $x_{S_i,k}$ ($k=1, \ldots, N_s$, $l=1, \ldots, p$ for $S_1$, and $l=1, \ldots, q$ for $S_2$).

The coding and modulation scheme corresponding to the relay, $C_R$, is based on a binary code $F_2^K \times F_2^K \to F_2^{n'}$ (the vector of the coded bits (redundancies) is denoted $c_R$, $c_R \in F_2^{n'}$, n'<n), an interleaver (the coded and interleaved bits are denoted $V_R \in F_2^{N_R \times m}$) and a modulator with a bit to symbol coding $\phi_R : F_2^m \to \chi_R \subseteq C$, where $\chi_R$ denotes the constellation of the symbols obtained of cardinality $|\chi_R| = 2^m$. The signal (code word) sent by the relay is denoted $x_R \in C^{N_R}$.

The manner of operation of the relay is described hereinafter in greater detail.

Figure 10:
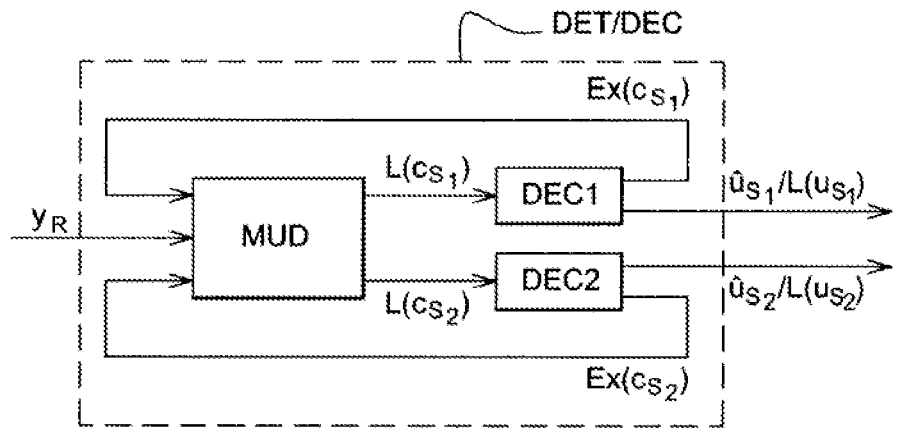
FIG. 10 is a detailed diagram of a joint detector/decoder DET/DEC of a relay illustrated by FIG. 6, 7 or 8.

The joint detector/decoder DET/DEC is illustrated by FIG. 10. The description covers both the case where this detector/decoder takes a hard decision or a soft decision.

The joint detector/decoder DET/DEC applies a joint detection/decoding scheme in an iterative manner. This scheme is implemented by a multiuser detector MUD followed by two decoders DEC1 and DEC2 in parallel.

The relay R receives a superposition, expressed by relation (1), of the signals of the two sources S1, S2, which is simplified in the case where the channel does not introduce any propagation delay (memory-less quasi-static channel):

$$y_{R,k} = y_{1R,k} + y_{2R,k} = h_{S_1 R} x_{S_1,k} + h_{S_2 R} x_{S_2,k} + n_{SR,k} \quad (2)$$

$$k = 1, \ldots, \alpha N$$

Where $n_{SR,k}$ denotes the Gaussian additive noise with distribution $CN(0, \sigma_n^2)$ and where $h_{S_1 R}$ and $h_{S_2 R}$ denote the coefficients of the link between a source S1, S2 and the relay R.

Figure 11:
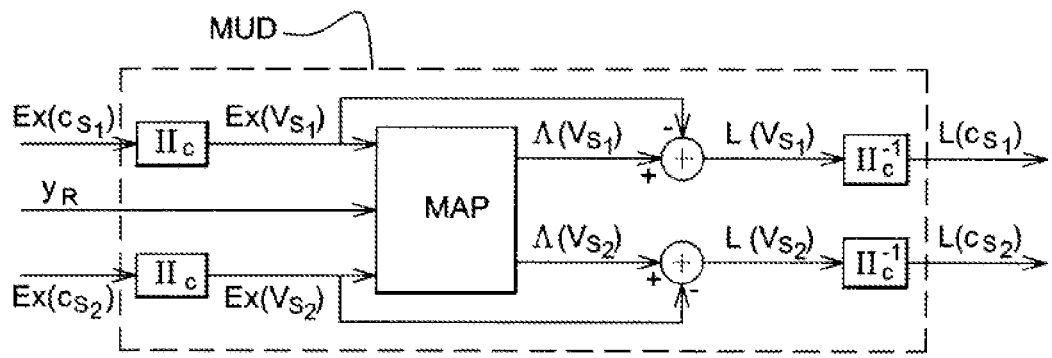
FIG. 11 is a detailed diagram of an MUD of a joint detector/decoder DET/DEC illustrated by FIG. 10.

At each iteration, the multiuser detector MUD, shown diagrammatically in FIG. 11, separates the streams on the basis of the data received $y_R$, extracts the information arising from each of the sources by implementing a MAP (Maximum a posteriori) detector. The MAP detector calculates the soft information of the coded bits of the two sources, in the form of a logarithmic probability ratio (LLR) $\{L(c_{S_1})\}$ and $\{L(c_{S_2})\}$, by utilizing the noisy observation arising from the channel $y_R$ and the a priori information about coded and interleaved bits $\{Ex(V_{S_1})\}$ and $\{Ex(V_{S_2})\}$ provided by the decoder DECi at the previous iteration.

The logarithmic probability ratio (LLR) of an $l^{th}$ bit of a symbol of each source $v_{S_i(l)} = \phi_{i(l)}^{-1}(x_{S_i})$ is calculated according to the following equations:

(To simplify the notation, the time indices are omitted.)

$$\Lambda(v_{S_i(l)}) = \log \frac{P(v_{S_i(l)} = 1 | y_R)}{P(v_{S_i(l)} = 0 | y_R)} \quad (3)$$

$$= \log \frac{\sum_{x_i \in \chi_i : \varphi_{i(l)}^{-1}(x_i)=1} \sum_{x_j \in \chi_j} p(y_R | x_{S_i} = x_i, x_{S_j} = x_j) e^{\xi(x_i)+\xi(x_j)}}{\sum_{x_i \in \chi_i : \varphi_{i(l)}^{-1}(x_i)=0} \sum_{x_j \in \chi_j} p(y_R | x_{S_i} = x_i, x_{S_j} = x_j) e^{\xi(x_i)+\xi(x_j)}}$$

$(i, j = 1, 2 \text{ and } i \neq j)$

Knowing the Gaussian distribution of the noise, this makes it possible to write:

$$\Lambda(v_{S_i(l)}) = \log \left\{ \frac{\sum_{x_i \in \chi_i : \varphi_{i(l)}^{-1}(x_i)=1} \sum_{x_j \in \chi_j} \exp\left(-\left\|\frac{y_R - h_{S_iR}x_i - h_{S_jR}x_j}{\sigma_n}\right\|^2 + \xi(x_i) + \xi(x_j)\right)}{\sum_{x_i \in \chi_i : \varphi_{i(l)}^{-1}(x_i)=0} \sum_{x_j \in \chi_j} \exp\left(-\left\|\frac{y_R - h_{S_iR}x_i - h_{S_jR}x_j}{\sigma_n}\right\|^2 + \xi(x_i) + \xi(x_j)\right)} \right\} \quad (4)$$

Where:

$$\xi(x_i) = \sum_{l'=1}^{\log_2|\chi_i|} \varphi_{i(l')}^{-1}(x_i) Ex(v_{S_i(l')}) \quad (5)$$

$$\xi(x_j) = \sum_{l'=1}^{\log_2|\chi_j|} \varphi_{j(l')}^{-1}(x_j) Ex(v_{S_j(l')}) \quad (6)$$

$(i, j = 1, 2, i \neq j$ and $l' \neq l)$

Where $\{Ex(v_{S_i(l)})\}$ are the logarithmic ratios of the a priori probabilities on the bits of each symbol, provided by the decoder at the previous iteration.

The extrinsic logarithmic probability ratios (LLR) at the output of the MAP detector are calculated according to the expression:

$$L(v_{s_i(l)}) = \Lambda(v_{S_i(l)}) - Ex(v_{S_i(l)}) \quad (7)$$

After deinterleaving performed by a deinterleaver $\pi_c^{-1}$ which performs the inverse function of the interleaver used at the send end in association with the channel coding, the MUD provides the extrinsic logarithmic probability ratios (LLR) on the coded bits $L(c_{S_i})$.

Figure 12:
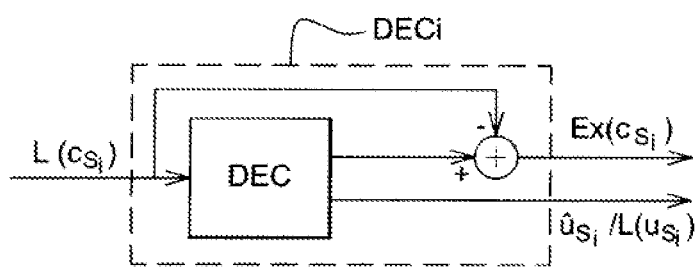
FIG. 12 is a detailed diagram of a decoder DECi of a joint detector/decoder DET/DEC illustrated by FIG. 10.

At each iteration, the decoders DECi, shown diagrammatically in FIG. 12, use respectively the vectors of the intrinsic logarithmic probability ratios (LLR) of the coded bits $\{L(c_{S_1})\}$ and $\{L(c_{S_2})\}$ provided by the MUD. They deliver extrinsic logarithmic probability ratios $\{Ex(c_{S_1})\}$ and $\{Ex(c_{S_2})\}$ on the coded bits $c_{S_1}$ and $c_{S_2}$. After interleaving, the extrinsic logarithmic probability ratios $Ex(V_{S_1})$ and $Ex(V_{S_2})$ on the coded and interleaved bits are utilized at the following iteration by the MUD as a priori logarithmic probability ratios. The interleaver is identical to that used at the send end in association with the channel coding.

At the last iteration, each decoder DECi takes a hard/soft decision and provides a vector $\hat{u}_{S_i}/L(u_{S_i})$ representative of the K information bits $u_{S_i}$.

Having regard to the scheduling in the senders and the relay in the half duplex semi-orthogonal case, each sender sends its code word during $\alpha N$, $\alpha \in [0,1]$ first transmission intervals and the relay sends the redundancy vector during $(1-\alpha)N$ second transmission intervals.

Figure 13:
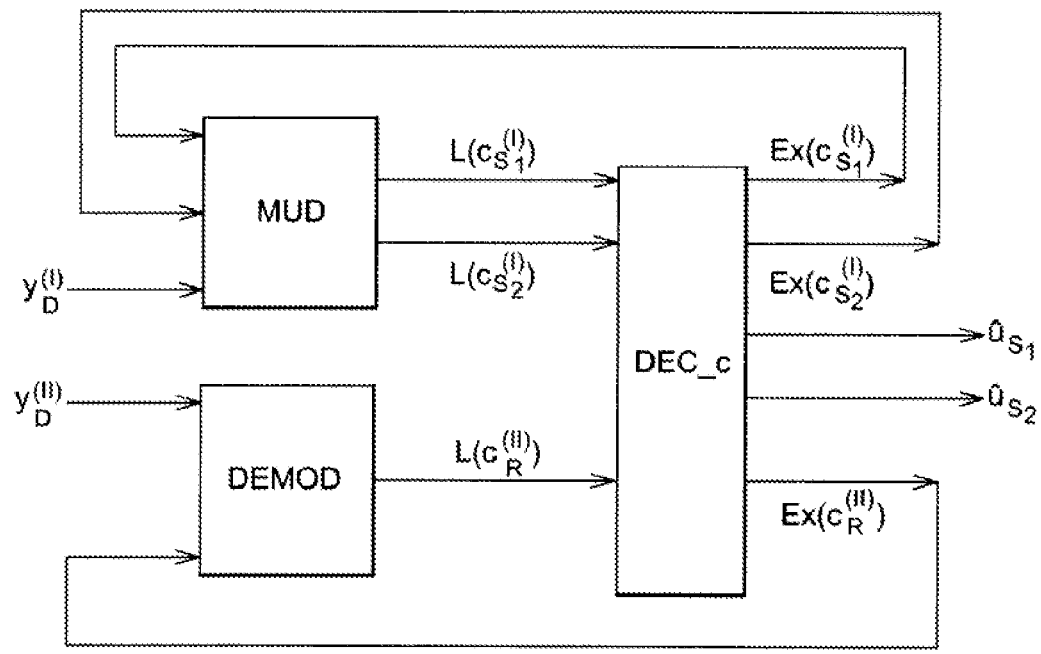
FIG. 13 is a diagram of a joint detector/decoder of a receiver according to an embodiment of the invention.

The receiver receives the redundancy information transmitted during the $(1-\alpha)N$ second transmission intervals emanating from the relay. It implements a processing to determine the original messages by utilizing the redundancy information as well as the superposed messages received from the two sources and sent during the $\alpha N$ first transmission intervals. The processing is implemented by a joint detector/decoder illustrated by FIG. 13. For the sake of simplicity, the channel interleavers are not represented.

The joint detector/decoder comprises a detector MUD and a demodulator DEMOD in parallel, followed by a joint decoder DEC_c. The MUD and the DEMOD utilize the information relating respectively to the $\alpha N$ and $(1-\alpha)N$ transmission intervals. The signals transmitted during these two successive phases can be expressed in the form:

$$y_{D,k}^{(I)} = h_{S_1D,k}^{(I)} x_{S_1,k}^{(I)} + h_{S_2D,k}^{(I)} x_{S_2,k}^{(I)} + n_k^{(I)} \quad (8)$$

(for the $\alpha N$ $1^{st}$ intervals) with $k=1, \ldots, \alpha N$ and $$y_{D,k}^{(II)} = h_{RD,k}^{(II)} x_{R,k}^{(II)} + n_k^{(II)} \quad (9)$$

(for the $(1-\alpha)N$ $2^{nd}$ intervals) with $k=\alpha N+1, \ldots, N$.

The following description relates to an exemplary implementation of a method of transmission and of a method of reception according to an embodiment of the invention, by a particular semi-orthogonal MARC system.

The semi-orthogonal MARC system comprises a half-duplex relay which implements a specific coding/decoding scheme of the distributed turbo code type. The two sources encode the data segmented per block of length K with a recursive systematic convolutional coder (RSCC) of rate ½. The result of the coding consists of coded bits made up of two parts: a $1^{st}$ part comprises the systematic part and a $2^{nd}$ part which is a $1^{st}$ redundancy part. The senders send (after interleaving and modulation) the $1^{st}$ and the $2^{nd}$ part of the coded bits destined for the relay and for the recipient (receiver) during the $1^{st}$ transmission intervals.

The relay receives the signals sent during the $1^{st}$ transmission intervals and does a soft joint detection/decoding followed by a soft encoding and a compression, as described previously with regard to FIG. 8.

Subsequent to the soft decoding, the relay obtains $\lambda_{1R} = L(u_{S_1})$ and $\lambda_{2R} = L(u_{S_2})$ which are representative of the K information bits of each source $u_{S_i}$.

Figure 14:
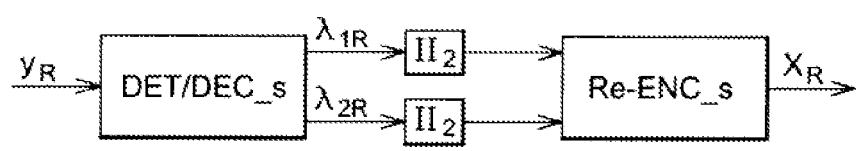
FIG. 14 is a sequencing diagram of the operations at the relay according to an embodiment of the invention.

On the basis of the values $\lambda_{1R}$ and $\lambda_{2R}$, the relay then determines the redundancy vector $X_R$ to be sent during the second transmission intervals. To this end, the relay interleaves the $\lambda_{1R}$ and $\lambda_{2R}$ values representative of the streams of the two sources, by means of two interleavers $\pi_2$, and then encodes these interleaved data by means of a soft coder RSCC Re_ENC_s of rate ⅔. The relay sends only the parity bits (selection of columns corresponding to the parity). In this case: $N=3K$, $\alpha=\frac{2}{3}$. This determination is illustrated by FIG. 14.

At the destination, the method of reception applies a Gaussian model to model the total disturbance on the signal received originating from the relay.

To maximize the SNR (Signal Noise Ratio) at the destination, the MARC system uses an MMSUE (Minimum Mean Squared Uncorrelated Error) criterion: the relay makes an optimal estimation on the basis of the a posteriori probabilities. This choice of criterion makes it possible to optimize the role of the relay. The principle of the MMSUE compression performed by the relay is as follows.

The relay generates probabilities on the symbols $S_{R,k}$ belonging to the constellation $\chi_R$:

$\phi_R : F_2^m \to \chi_R \subseteq C$, where each modulated symbol belongs to the complex set $\chi_R$ of cardinality $|\chi_R|=2^m$. Therefore, $v_{R,k(l)} = \phi_{R(l)}^{-1}(s_{R,k})$ $k=1, \ldots, N_R$, $l=1, \ldots, m$ denotes the $l^{th}$ bit of the binary label of $s_{R,k}$. The energy of the symbols is normalized to one to simplify the notation.

The relay sends information on the packets of the nodes $S_1$ and $S_2$ which is encoded and modulated with $C_R$ over $N_R$ transmission intervals. The following complex symbols are sent by the relay during the $N_R$ transmission intervals:

$$x_{R,k} = f(s_{R,k}) = \sqrt{\frac{P_R}{\sigma_{\tilde{s}_{R,k}}^2}} \tilde{s}_{R,k}, k = 1, \ldots, N_R \tag{10}$$

with $$\tilde{s}_{R,k} = \sum_{a \in \chi_R} s_{R,k} P(s_{R,k} = a) \tag{11}$$

and $$\sigma_{\tilde{s}_R}^2 = \frac{1}{N_R} \sum_{k=1}^{N_R} |\tilde{s}_{R,k}|^2 \tag{12}$$

Where $P_R$ is the energy available to the relay.

At the receiver, in the particular case of a Gaussian channel without interference, the symbols $x_{R,k}$ are detected in the sense of the mean squared error so as to obtain the estimates $\hat{x}_{R,k} = x_{R,k} + n_k$ where $n_k$ is assumed Gaussian with known variance $\sigma^2$, according to a first Gaussian approximation.

By generalizing the concept of MMSUE (minimum mean squared uncorrelated error) to coded data, the estimates $\hat{x}_{R,k}$ can be expressed in the form:

$$\begin{aligned}\hat{x}_{R,k} &= x_{R,k} + n_k \\ &= \frac{\sigma_{\tilde{s}_R}}{\sigma_{\tilde{s}_R}^2} \sqrt{P_R} (s_{R,k} + e_k) + n_k \\ &= \sigma_{\tilde{s}_R} \sqrt{P_R} s_{R,k} + \sigma_{\tilde{s}_R} \sqrt{P_R} e_k + n_k \\ &= \sigma_{\tilde{s}_R} \sqrt{P_R} s_{R,k} + n'_k \end{aligned} \tag{13}$$

the variance of $n'_k$ being $\sigma^2 + P_R(1-\sigma_{\tilde{s}_R}^2)$

A second Gaussian approximation on $n'_k$ makes it possible to retrieve the probabilities $P(s_{R,j}=a)$, $a \in \chi_R$ which are proportional to:

$$e^{-\frac{|\hat{x}_{R,k} - \sigma_{\tilde{s}_R} \sqrt{P_R} s_{R,k}|^2}{\sigma^2 + P_R(1-\sigma_{\tilde{s}_R}^2)}} \tag{14}$$

By assumption, the nodes of the distributed network know their respective transmit power.

The relay sends the redundancy vector $x_R$ during the second transmission intervals corresponding solely to the K parity bits of the systematic recursive code.

Thus, during the $1^{st}$ transmission intervals, the recipient receives a superposition of the code words sent by the two senders: the code words comprising the systematic part and a $1^{st}$ redundancy part of the coded bits. During the second transmission intervals, the recipient receives the redundancy vector determined by the relay.

Figure 15:
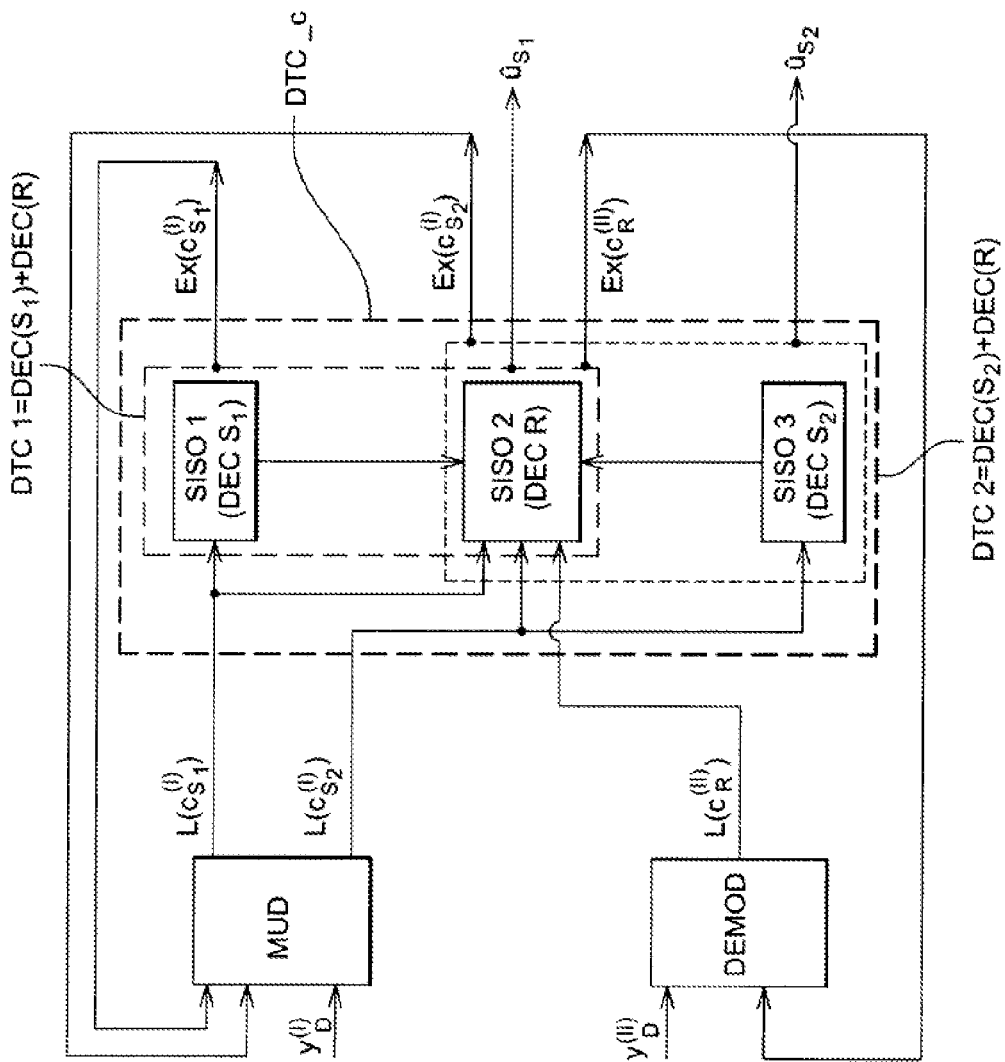
FIG. 15 is a detailed diagram of a joint detector/decoder of a receiver according to an embodiment of the invention.

After receiving these various code words, the receiver detects and decodes the various streams received by means of a joint detector/decoder. This joint detector/decoder, illustrated by FIG. 15, comprises a detector MUD and a demodulator DEMOD in parallel, followed by a joint decoder DEC_c.

At each iteration, the MUD uses a MAP detector to separate the two streams (of the two sources) and to calculate the logarithmic probability ratios (LLR) on the coded bits and in parallel, the demodulator DEMOD calculates, on the basis of the symbols received emanating from the relay, the LLRs on the coded bits according to the MAP criterion.

The MUD utilizes the signals corresponding to the first transmission intervals and separates the streams of the two sources; it provides the logarithmic probability ratios (LLR) $L(c_{S_1}^{(I)})$ and $L(c_{S_2}^{(I)})$ on the coded bits sent during the $1^{st}$ transmission intervals. The principle of operation of the MUD is identical to the manner of operation already described with regard to FIG. 11.

The demodulator DEMOD utilizes the signals corresponding to the second transmission intervals to detect and demodulate the stream originating from the relay. The demodulator DEMOD uses the MAP criterion for demodulation while taking into account the MMSUE compression performed in the relay: the demodulator DEMOD must take into account the variance of the MMSUE equivalent noise during demodulation.

The demodulator DEMOD provides the logarithmic probability ratios (LLR) $L(c_R^{(II)})$ on the coded bits of the relay sent during the $2^{nd}$ transmission intervals. The signal received at the input of the demodulator DEMOD can be expressed in the form:

$$\begin{aligned}y_D^{(II)} &= h_{RD}^{(II)} x_{R,k}^{(II)} + n_k^{(II)} \\ &= h_{RD}^{(II)} \left( \sigma_{\tilde{s}_R^{(II)}} \sqrt{P_R} (s_{R,k}^{(II)} + e_k^{(II)}) \right) + n_k^{(II)} \\ &= h_{RD}^{(II)} \sigma_{\tilde{s}_R^{(II)}} \sqrt{P_R} s_{R,k}^{(II)} + n'_k \end{aligned} \tag{15}$$

$$k = 2K+1, \ldots, 3K$$

where:

$$n'_k = h_{RD}^{(II)} \sigma_{\tilde{s}_R^{(II)}} \sqrt{P_R} e_k^{(II)} + n_k^{(II)} \tag{16}$$

is the equivalent noise at the destination, with zero mean and variance $\sigma_{n'}^2$:

$$\sigma_{n'}^2 = \sigma_{n^{(II)}}^2 + P_R |h_{RD}^{(II)}|^2 (1 - \sigma_{\tilde{s}_R^{(II)}}^2) \tag{17}$$

By considering the stream received and knowing the expression for the noise, the demodulator DEMOD determines:

(To simplify the notation, the time indices are omitted.)

$$\Lambda(v_{R(t)}^{(II)}) = \log \left( \sum_{s_R \in \chi_R : \varphi_{R(t)}^{-1}(s_R)=1} A \bigg/ \sum_{s_R \in \chi_R : \varphi_{R(t)}^{-1}(s_R)=0} B \right) \tag{18}$$

with:

$$A = \exp\left( -\frac{\left\| y_D^{(II)} - h_{RD}^{(II)} \sigma_{\tilde{s}_R^{(II)}} \sqrt{P_R} s_R \right\|^2}{\sigma_{n'}} + \xi(s_R) \right) \tag{19}$$

$$B = \exp\left( -\frac{\left\| y_D^{(II)} h_{RD}^{(II)} \sigma_{\tilde{s}_R} \sqrt{P_R} s_R \right\|^2}{\sigma_{n'}} + \xi(s_R) \right) \tag{20}$$

Where:

$$\xi(s_R) = \sum_{l'=1}^{log_2|X_R|} \varphi_{R(l')}^{-1}(s_j) Ex(v_{R(l')}^{(II)}) \quad (21)$$

and:

$$L(v_{R(l)}^{(II)}) = \Lambda(v_{R(l)}^{(II)}) - Ex(v_{R(l)}^{(II)}) \quad (22)$$

After deinterleaving, the intrinsic logarithmic probability ratios of the redundancy bits $L(c_R^{(II)})$ are obtained as output from the demodulator DEMOD.

The joint decoder DEC_c is formed of two turbo decoders DTC1, DTC2 each comprising two decoders respectively SISO1, SISO2 and SISO3, SISO2 with soft inputs and soft outputs, one of the decoders being shared: SISO2(DEC R). The decoders SISOi utilize the intrinsic logarithmic probability ratios of the coded bits $L(c_{S_1}^{(I)})$, $L(c_{S_2}^{(I)})$ and of the redundancy bits $L(c_R^{(II)})$ and provide extrinsic logarithmic probability ratios $Ex(c_{S_1}^{(I)})$, $Ex(c_{S_2}^{(I)})$, and $Ex(c_R^{(II)})$ on the coded bits. After interleaving, these values are utilized as a priori information by the MUD and the demodulator DEMOD.

Let $L_{S_i}^I$ be the soft information of the systematic bits of the two sources and $L_{P_i}^I$, $L_{P_R}^{II}$ the soft information of the parity bits corresponding to the two sources and to the relay provided by the MUD and the demodulator DEMOD (i=1,2).

Let $Ex_{S_i(j)}^I$, $Ex_{P_i(j)}^I$, and $Ex_{P_R(j)}^{II}$ be the extrinsic information generated by the decoders SISO j (j=1, . . . , 3).

The iterative processing implemented by the decoder DEC_c proceeds as follows:
1. The MUD utilizes (after re-interleaving) $Ex_{S_1(1)}^I + \Pi_2^{-1}$ $(Ex_{S_1(2)}^I)$, $Ex_{P_1(1)}^I$, $\Pi_2^{-1}$ $(Ex_{S_2(2)}^I) + Ex_{S_2(3)}^I$, $Ex_{P_2(3)}^I$, and the demodulator DEMOD utilizes (after re-interleaving) $Ex_{P_R(2)}^{II}$, as a priori information and they produce the intrinsic logarithmic probability ratios (the first iteration is different in the sense that there is no a priori information).
2. DTC 1 and DTC 2 are active:
   2.a) SISO1 and SISO3 operate simultaneously:
   SISO1 utilizes $L_{S_1}^I$ and $L_{P_1}^I$ and utilizes $\Pi_2^{-1}(Ex_{S_1(2)}^I)$ obtained at the previous iteration as a priori information and calculates by means of a BCJR algorithm $Ex_{S_1(1)}^I$ and $Ex_{P_1(1)}^I$,
   SISO3 utilizes $L_{S_2}^I$ and $L_{P_2}^I$ and utilizes $\Pi_2^{-1}(Ex_{S_2(2)}^I)$ obtained at the previous iteration as a priori information and calculates by means of a BCJR algorithm $Ex_{S2(3)}^I$ and $Ex_{P_2(3)}^I$,
   2.b) SISO2 utilizes $\Pi_2(L_{S_1}^I)$, $\Pi_2(L_{S_2}^I)$, and $L_{P_R}^{II}$, and utilizes $\Pi_2(Ex_{S_1(1)}^I)$ and $\Pi_2(Ex_{S_2(3)}^I)$ as a priori information, and calculates by means of a BCJR algorithm $Ex_{S_2(2)}^I$, $Ex_{P_R(2)}^{II}$, and $Ex_{S_1(2)}^I$
3. Returning to step 1 with consideration of the new a priori values.

After a few iterations, the hard decisions are made on the basis of:

$$L_{S_1}^I + Ex_{S_1(1)}^I + \Pi_2^{-1}(Ex_{S_1(2)}^I) \text{ and}$$

$$L_{S_2}^I + \Pi_2^{-1}(Ex_{S_2(2)}^I) + Ex_{S_2(3)}^I$$

to provide $\hat{u}_{S_1}$ and $\hat{u}_{S_2}$ respectively.

According to a particular use, the two sources correspond to two different users, for example two mobile terminals. According to another use, the two sources can correspond to two different services accessible from one and the same terminal but in this case, the terminal is equipped with at least two antennas which determine two different propagation channels between the terminal and the relay and between the terminal and the destination.

Although the present disclosure has been described with reference to one or more examples, workers skilled in the art will recognize that changes may be made in form and detail without departing from the scope of the disclosure and/or the appended claims.

The invention claimed is:

1. A method for transmitting a digital signal intended for a Multiple Access Relay Channel (MARC) system with at least four nodes comprising two senders, a relay and a receiver separated from one another by non-orthogonal links except between the relay and the receiver, between which the link is orthogonal, implementing a spatially distributed network code, the method comprising:
    a step of coding, in each sender, delivering a code word per block of K information bits,
    a step of sending, in the senders, the code word during αN transmission intervals, α∈[0,1],
    a step of iterative joint detection/decoding, in the relay, so as to separate interfering streams originating from the senders and determine per stream a vector representative of the K information bits associated with the code word,
    a step of joint coding, in the relay, of the two vectors so as to determine redundancy information, and
    a scheduling in the relay so as to send the redundancy information during the (1−α)N following transmission intervals,
    wherein N denotes the total number of channel uses, and
    wherein the step of iterative joint detection/decoding and implements a soft decoding and the step of joint coding implements a soft coding with marginalization preformed at a bit level.

2. A method for transmitting a digital signal intended for a Multiple Access Relay Channel (MARC) system with at least four nodes comprising two senders, a relay and a receiver separated from one another by non-orthogonal links except between the relay and the receiver, between which the link is orthogonal, implementing a spatially distributed network code, the method comprising:
    a step of coding, in each sender, delivering a code word per block of K information bits,
    a step of sending, in the senders, the code word during αN transmission intervals, α∈[0,1],
    a step of iterative joint detection/decoding, in the relay, so as to separate interfering streams originating from the senders and determine per stream a vector representative of the K information bits associated with the code word,
    a step of joint coding, in the relay, of the two vectors so as to determine redundancy information, and
    a scheduling in the relay so as to send the redundancy information during the (1−α)N following transmission intervals,
    wherein N denotes the total number of channel uses, and
    wherein the iterative joint detection/decoding step implements a soft decoding and the joint coding step implements a soft coding and a compression.

3. The method as claimed in claim 2, in which the compression is performed by using a mean squared uncorrelated error criterion.

4. The method as claimed in claim 1, implementing a turbo code distributed between the senders and the relay and in which the coding step in the senders implements a convolutional coder.

5. A non-transitory information medium comprising program instructions stored thereon and adapted to implement a method for transmitting a digital signal when said program is loaded and executed in a semi-orthogonal Multiple Access Relay Channel (MARC) system, wherein the digital signal is transmitted in network with at least four nodes comprising two senders, a relay and a receiver separated from one another by non-orthogonal links except between the relay and the receiver, between which the link is orthogonal, implementing a spatially distributed network code, and wherein the program instructions comprise:
    instructions configured to implement a step of coding, in each sender, delivering a code word per block of K information bits,
    instructions configured to implement a step of sending, in the senders, the code word during αN transmission intervals, α∈[0,1],
    instructions configured to implement a step of iterative joint detection/decoding, in the relay, so as to separate interfering streams originating from the senders and determine per stream a vector representative of the K information bits associated with the code word,
    instructions configured to implement a step of joint coding, in the relay, of the two vectors so as to determine redundancy information, and
    instructions configured to implement a step of scheduling in the relay so as to send the redundancy information during the (1−α)N following transmission intervals,
    wherein N denotes the total number of channel uses and
    wherein the iterative joint detection/decoding step implements a soft decoding and the joint coding step implements a soft coding and a marginalization performed at a bit level.

6. A relay configured for use in a semi-orthogonal Multiple Access Relay Channel (MARC) system for transmitting a digital signal in a network with at least four nodes comprising two senders, the relay and a receiver separated from one another by non-orthogonal links except between the relay and the receiver, between which the link is orthogonal, implementing a spatially distributed network code, the relay comprising:
    means for iterative joint detection/decoding for separating interfering streams originating from the two senders of the semi-orthogonal MARC system, for implementing a soft decoding and for determining, per stream, a vector representative of K information bits associated with a code word sent by a sender during αN transmission intervals, α∈[0,1],
    means for joint coding of the vectors of the two streams by implementing a soft coding with a marginalization performed at a bit level and for determining redundancy information,
    means for sending the redundancy information during (1−α)N transmission intervals which follow the αN transmission intervals during which the code words are sent by the two senders,
    wherein N denotes the total number of channel uses.

7. A semi-orthogonal Multiple Access Relay Channel (MARC) system comprising the relay claimed in claim 6.

8. A method receiving a digital signal by a receiver of a semi-orthogonal Multiple Access Relay Channel (MARC) system in which a digital signal is transmitted in a network with at least four nodes comprising two senders, a relay and the receiver separated from one another by non-orthogonal links except between the relay and the receiver, between which the link is orthogonal, implementing a spatially distributed network code, the method of receiving comprising:
    a step of storage in a block of data received during αN, transmission intervals, α∈[0,1], corresponding to K information bits coded per sender in the form of a code word sent during the αN transmission intervals, and comprising in an iterative manner:
        the step of detection of compressed soft encoded redundancy information originating from a relay and received during (1−α)N transmission intervals which follow the αN transmission intervals taking into account the equivalent channel resulting from the transmission of the compressed soft encoded redundancy information,
        a detection step of separating interfering streams originating from the senders on the basis of a block of data received, and
        a joint decoding step of determining per sender a decoding value for the K information bits by jointly decoding the separate streams and the detected redundancy information,
    wherein N denotes the total number of channel uses.

9. A receiver configured for use in a semi-orthogonal Multiple Access Relay Channel (MARC) system in which a digital signal is transmitted in a network with at least four nodes comprising two senders, a relay and the receiver separated from one another by non-orthogonal links except between the relay and the receiver, between which the link is orthogonal, implementing a spatially distributed network code, the receiver comprising:
    means for storing in a block data received during αN, transmission intervals corresponding to K information bits coded per sender in the form of a code word sent during the αN transmission intervals, α∈[0,1], and
    two means for block detection in parallel, followed by a joint decoder for, in an iterative manner, separating two interfering streams originating from the senders during the αN transmission intervals, detecting compressed soft encoded redundancy information taking into account the equivalent channel resulting from the transmission of the compressed soft encoded redundancy information originating from the relay during the (1α)N following transmission intervals and determining on the basis of the separate streams and of the detected redundancy information, a decoding value for the K information bits per sender,
    wherein N denotes the total number of channel uses.

10. The method as claimed in claim 2, implementing a turbo code distributed between the senders and the relay and in which the coding step in the senders implements a convolutional coder.

11. A non-transitory information medium comprising program instructions stored thereon and adapted to implement a method for transmitting a digital signal when said program is loaded and executed in a semi-orthogonal Multiple Access Relay Channel (MARC) system, wherein the digital signal is transmitted in network with at least four nodes comprising two senders, a relay and a receiver separated from one another by non-orthogonal links except between the relay and the receiver, between which the link is orthogonal, implementing a spatially distributed network code, and wherein the program instructions comprise:
    instructions configured to implement a step of coding, in each sender, delivering a code word per block of K information bits,
    instructions configured to implement a step of sending, in the senders, the code word during αN transmission intervals, α∈[0,1],
    instructions configured to implement a step of iterative joint detection/decoding, in the relay, so as to separate interfering streams originating from the senders and determine per stream a vector representative of the K information bits associated with the code word, instructions configured to implement a step of joint coding, in the relay, of the two vectors so as to determine redundancy information, and instructions configured to implement a step of scheduling in the relay so as to send the redundancy information during the $(1-\alpha)N$ following transmission intervals wherein N denotes the total number of channel uses, and wherein the iterative joint detection/decoding step implements a soft decoding and the joint coding step implements a soft coding and a compression.

12. A relay configured for use in a semi-orthogonal Multiple Access Relay Channel (MARC) system for transmitting a digital signal in a network with at least four nodes comprising two senders, the relay and a receiver separated from one another by non-orthogonal links except between the relay and the receiver, between which the link is orthogonal, implementing a spatially distributed network code, the relay comprising:

means for iterative joint detection/decoding for separating interfering streams originating from the two senders of the semi-orthogonal MARC system by implementing a soft decoding and for determining, per stream, a vector representative of K information bits associated with a code word sent by one of the senders during $\alpha N$ transmission intervals, $\alpha \epsilon [0,1]$, means for joint coding of the vectors of the two streams by implementing a soft coding and a compression for determining redundancy information, and means for sending the redundancy information during $(1-\alpha)N$ transmission intervals which follow the $\alpha N$ transmission intervals during which the code words are sent by the two senders, wherein N denotes the total number of channel uses.

* * * * *